United States Patent [19]

Jutamulia et al.

[11] Patent Number: 5,144,145
[45] Date of Patent: Sep. 1, 1992

[54] OPTICAL IMAGE SUBTRACTION EMPLOYING ELECTRON TRAPPING MATERIALS

[75] Inventors: Suganda Jutamulia, Rockville, Md.;
George M. Storti, Washington, D.C.;
Joseph Lindmayer, Potomac, Md.

[73] Assignee: Quantex Corporation, Rockville, Md.

[21] Appl. No.: 697,002

[22] Filed: May 8, 1991

Related U.S. Application Data

[63] Continuation-in-part of Ser. No. 419,479, Oct. 10, 1989, Pat. No. 5,029,253.

[51] Int. Cl.⁵ .............................................. G03C 5/16
[52] U.S. Cl. ................................... 250/484.1; 250/330
[58] Field of Search ................. 250/484.1, 327.2, 330; 364/413.23

[56] References Cited

U.S. PATENT DOCUMENTS 5,051,587  9/1991  Arakawa ........................... 250/484.1
5,065,023  11/1991  Lindmayer ........................ 250/484.1

Primary Examiner—Carolyn E. Fields
Assistant Examiner—Drew A. Dunn
Attorney, Agent, or Firm—Ostrolenk, Faber, Gerb & Soffen

[57] ABSTRACT

A method for using electron trapping materials to perform subtraction of images. One image is written onto a 2-dimensional screen of electron trapping material. A second image that has many of the elements of the first, but less than the total number of elements of the first, is erased from the electron trapping screen with infrared light. An exposure of the entire screen to infrared light results in luminescence output from those regions in which electrons remain trapped after the subtraction. Potential applications include machine inspection, image compression, etc. Images can be written on the screen of electron trapping material using energetic radiation or using short wavelength visible light.

14 Claims, 4 Drawing Sheets

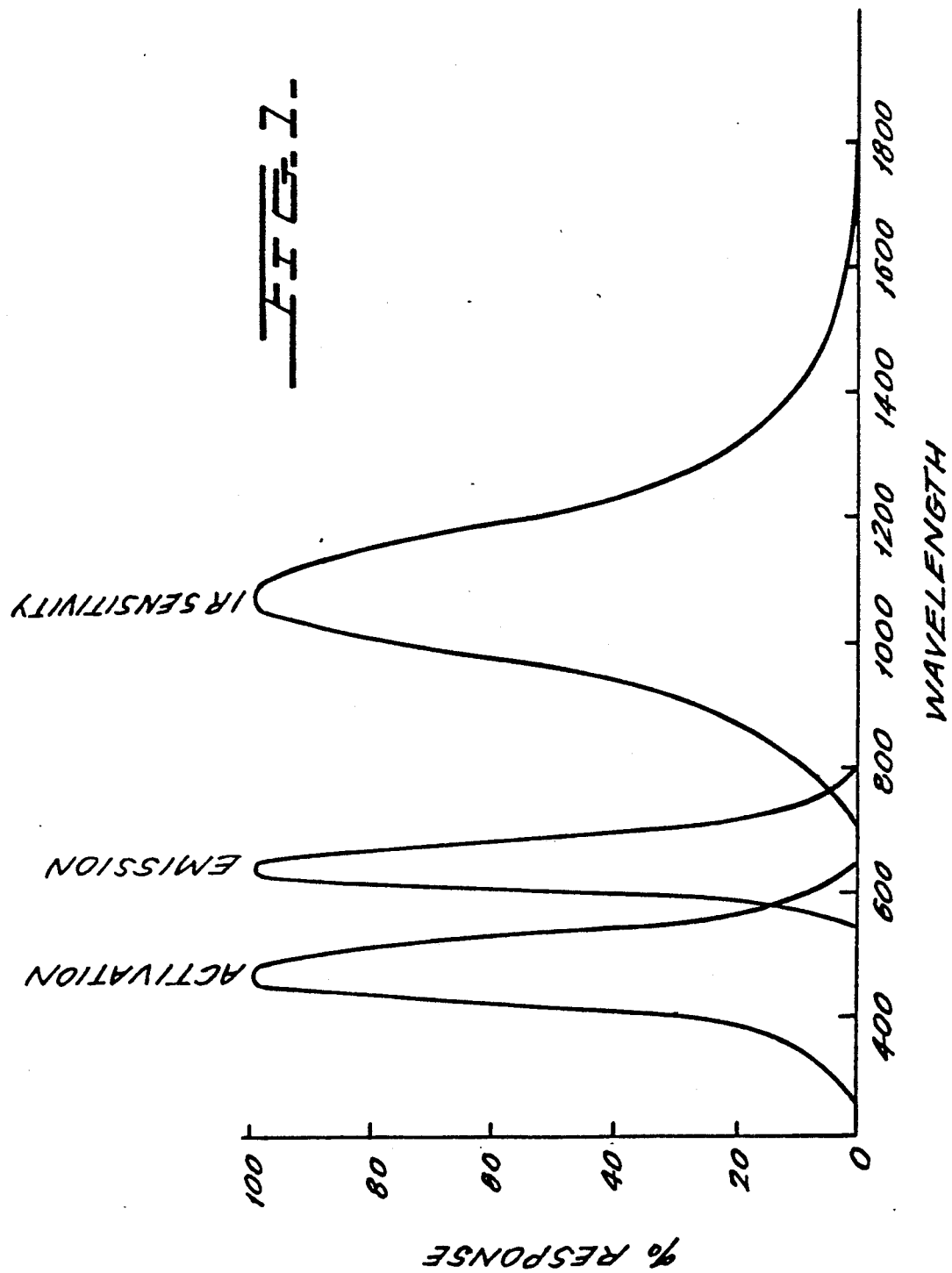

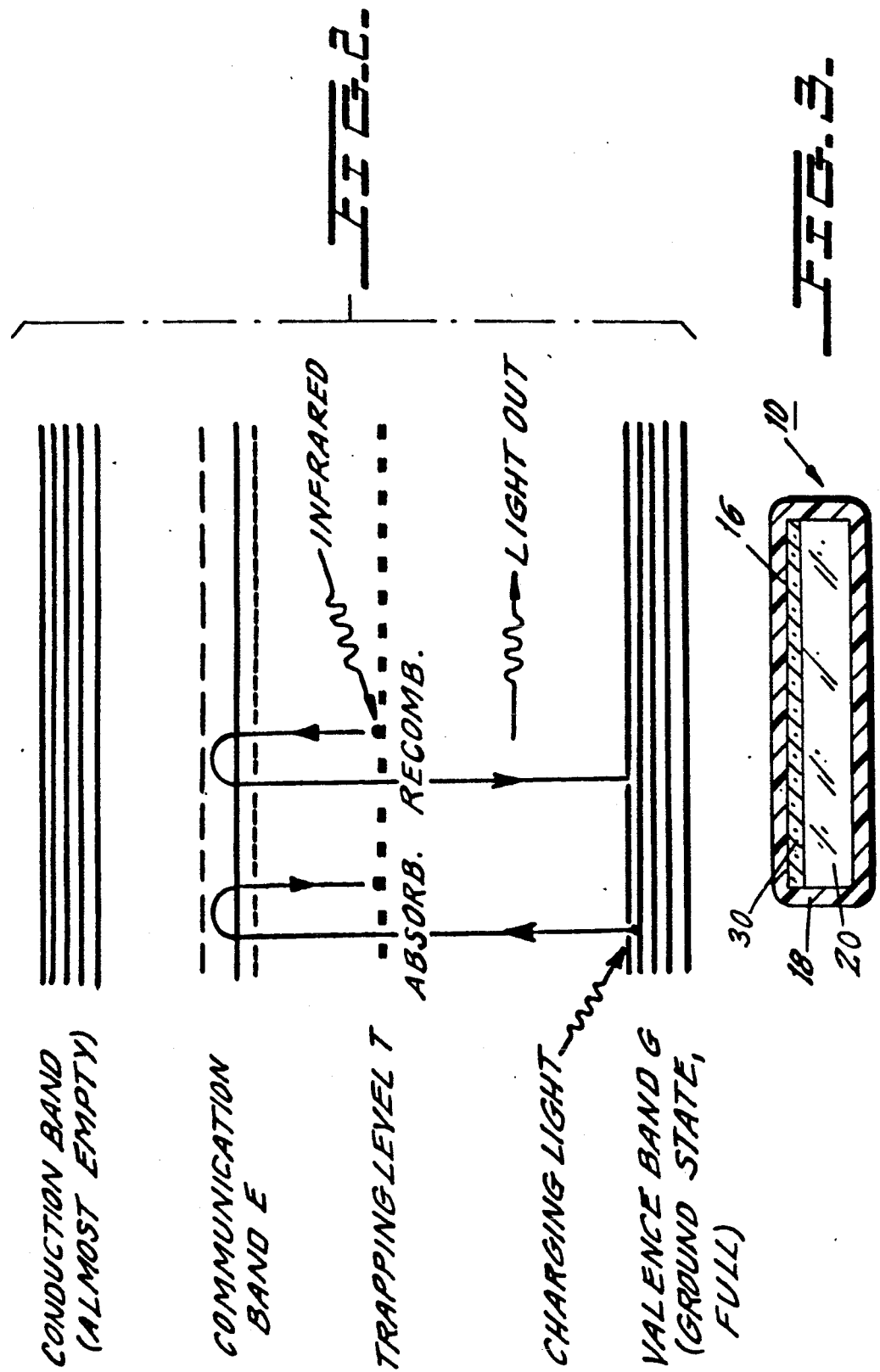

OPTICAL IMAGE SUBTRACTION EMPLOYING ELECTRON TRAPPING MATERIALS

RELATED APPLICATIONS

This is a continuation-in-part of U.S. application Ser. No. 07/419,479, filed Oct. 10, 1989 now U.S. Pat. No. 5,029,253, entitled "Spatial Light Modulation Using Electron Trapping Materials", the disclosure of which is herein incorporated by reference.

BACKGROUND OF THE INVENTION:

1. Field of the Invention:

The present invention relates to optical signal processing using electron trapping materials, and more specifically, to the use of electron trapping materials for incoherent image subtraction.

2. Description of the Related Art:

The capabilities of electron trapping materials having been demonstrated in various disciplines of optical signal processing. For example, the application of electron trapping materials to parallel Boolean logic has been reported by S. Jutamulia, G. M. Storti, J. Lindmayer, and W. Seiderman in "Application of Electron Trapping (ET) Materials to Optical Parallel Logic Processing," *Proc. SPIE*, 1151, 83, 1989. The use of electron trapping materials in memory devices has been demonstrated by S. Jutamulia, J. Lindmayer, and G. Storti in "Optical Pattern Recognition and Associative Memory Using Electron Trapping Materials," *Proc. SPIE* 1053, 67, 1989. Recently, the capabilities of electron trapping materials applied to Hopfield type neural networks has been discussed by S. Jutamulia, G. M. Storti, J. Lindmayer, W. Seiderman in "Optical Neural Network Digital Multi-Value Processor with Learning Capability Using Electron Trapping Materials," *Proc. SPIE* 1215, 457, 1990.

Other areas of optical signal processing have the potential to realize further advances from the continuing developments in electron trapping material applications. One such area of particular current interest is that of image subtraction, which has proved very useful in automatic surveillance and inspection. Image subtraction techniques can also be applied to bandwidth compression in communication based on an interframe coding paradigm, such as described by T. J. Lynch in *Data Compression, Techniques and Applications*, Lifetime Learning, Belmont, Calif., 1985.

There are several known methods for optically subtracting one image from another in order to detect differences between scenes. A review of various image subtraction techniques has been presented in a classic paper by J. F. Ebersole, "Optical Image Subtraction," *Opt. Eng.* 14, 426, 1975, as well as in a more recent paper by H. K. Liu and T. H. Chao, "Optical Image Subtraction Techniques, 1975-1985," *Proc. SPIE* 638, 55, 1986. Rapid progress in the development of real-time electro-optic devices has also stimulated many new techniques in image subtraction, such as those reported by F. T. S. Yu, M. F. Cao, and X. J. Lu, in "Real-Time Programmable Image Subtractor Using a Magnetooptic Device," *Appl. Opt.* 25, 3773, 1986; see also F. T. S. Yu, S. Jutamulia, D. A. Gregory, "Real-Time Liquid Crystal TV XOR- and XNOR- Gate Binary Image Subtraction Technique," *Appl. Opt.* 26, 2738, 1987.

These known techniques as reported in the cited publications, however, have limitations, such as a low space-bandwidth product (SBP), coherent noise, and difficulty in performing gray level image subtraction.

While progress has been made in the area of optical imagery, the features and advantage of electron trapping materials to image subtraction has heretofore been lacking. While current techniques are satisfactory in some applications, they do not overcome the limitations mentioned above that presently exist in the field, nor do they provide the advantages realized with the use of electron trapping materials to image subtraction using the method described below.

SUMMARY OF THE INVENTION

The present invention overcomes the disadvantages of the prior art noted above by providing a novel method of image subtraction in which a first image of visible light or energetic radiation is written into an electron trapping material, the first energy of the image raising electrons in the electron trapping material from the ground level to the trapping level of the material at selected locations corresponding to the first image. Next, a second image of infrared radiation is written into the electron trapping material, the infrared radiation of the second image releasing trapped electrons in the electron trapping material at selected locations corresponding to the second image, such that electrons remain in traps only at locations in the electron trapping material where said second image does not coincide with said first image. Finally, the electron trapping material is uniformly exposed to infrared radiation to release said remaining electrons from their traps, resulting in the emission of incoherent light from the electron trapping material in a pattern corresponding to the difference between the first image and the second image.

In a preferred embodiment of the invention, the first image is formed of blue light or energetic radiation such as X-rays, alpha particles, beta particles, ultraviolet light, or gamma rays.

The method of the present invention can also be used for the inspection of a microchip circuit transparency. In this case, an image of a correct microchip circuit transparency is projected onto the electron trapping material using visible light or other energetic radiation, the energy of the first image raising electrons in the electron trapping material from the ground level to the trapping level of the material at selected locations corresponding to the image of the correct microchip circuit transparency. Next, an image of a test microchip circuit transparency is projected onto the electron trapping material using infrared radiation, the infrared radiation releasing trapped electrons in the electron trapping material at selected locations corresponding to the image of the test microchip circuit transparency, such that electrons remain in traps only at locations in the electron trapping material where the test microchip circuit transparency does not coincide with the correct microchip circuit transparency. Finally, the electron trapping material is uniformly exposed to infrared radiation to release the remaining electrons from their traps, resulting in the emission of incoherent light from the electron trapping material in a pattern indicating where the test microchip circuit transparency differs from the correct microchip circuit transparency.

In an alternative embodiment, image subtraction can be performed by first uniformly exposing the electron trapping material to visible light or energetic radiation, the energy from the visible light or energetic radiation raising electrons in the electron trapping material from the ground level to the trapping level of the material, such that the trapping level becomes substantially filled with electrons. Next, a first image of infrared radiation is projected onto the electron trapping material, the infrared radiation releasing electrons from their traps at selected locations corresponding to the first image, such that electrons remain in traps only at locations corresponding to the negative of the first image. Finally, a second image of infrared radiation is projected onto said electron trapping material, the infrared radiation of the second image releasing the remaining electrons from their traps at locations corresponding to where the second image coincides with the first image, resulting in the emission of incoherent light from the electron trapping material in a pattern corresponding to the second image partially blocked by the first image.

Other features and advantages of the invention will be set forth in, or apparent from, the detailed description of the preferred embodiments of the invention which follow

BRIEF DESCRIPTION OF THE DRAWINGS

For a complete understanding of the objectives and structure of the invention, reference is made to the following detailed description and accompanying drawings, wherein:

FIG. 1 shows the excitation, activation and emission spectra of a typical electron trapping material utilized in the present invention.

FIG. 2 shows the principles of operation of the electron trapping material used in the present invention.

FIG. 3 shows a cross-section of a substrate coated with electron trapping material for use in the present invention.

DETAILED DESCRIPTION OF THE PREFERRED EMBODIMENTS

Figure 4A:
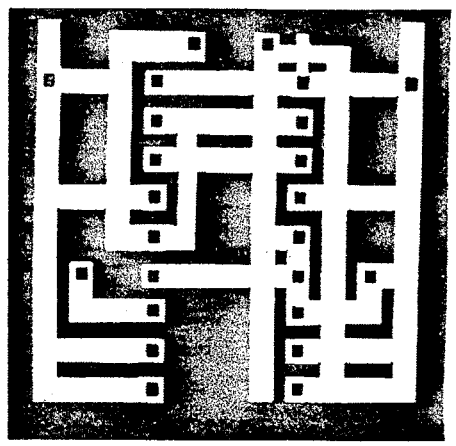
FIG. 4A shows a simulated reference visual image in the form of a microcircuit chip transparency.

In view of the importance of electron trapping materials to the present invention, a brief review of their relevant characteristics, which are more fully described in the cited patents, is appropriate.

A. Electron Trapping Materials

Electron trapping materials characteristically can emit different output photons which correlate spatially in intensity with input photons. The preferred electron trapping material of the present invention is formed of an alkaline earth metal sulfide base doped with rare earth impurities. A number of different electron trapping materials have been developed by the assignee of the present application For example, U S. Pat. No. 4,839,092 discloses a material formed of a strontium sulfide base doped with samarium and europium (SrS:Sm,Eu). This material outputs orange light centered at 620 nm. Similarly, U.S. Pat. No. 4,842,960 discloses a material formed of a mixed strontium sulfide/calcium sulfide base doped with samarium and europium/cerium (SrS/CaS:Sm,Eu/Ce). This material also emits orange light, but has a very high efficiency and a brighter output than the material without calcium sulfide. As shown in FIG. 1, the activation wavelength of this preferred SrS/CaS:Sm,Eu/Ce material is about 450 nm, its emission wavelength is orange (about 630 nm) and it stimulation wavelength is near-infrared. U.S. Pat. No. 4,879,186 discloses a material formed of a calcium sulfide base doped with samarium and europium (CaS:Sm,Eu), which outputs a reddish-orange light centered at 650 nm.

Each of the above electron trapping materials have electron traps with depths of about 1.0 to 1.2 electron volts. Further details of the materials and the processes for making the materials are set forth in the disclosure of each of the above-referred U.S. patents, which are herein incorporated by reference.

Briefly, the mechanism for light emission of electron trapping materials can be explained as follows, using the SrS:Sm,Eu material as an example, with reference to FIG. 2: Both ground and excited states of each impurity exist within the band gap of the wide-band-gap (approx. 4.4 eV) host material. Short wavelength visible light (e.g., blue) excites electrons from the ground state (valence band G)to an excited state of Eu (communication band E), from whence the electrons transfer over to Sm. The electrons remain in the ground state of Sm (trapping level T) for very long times. However, subsequent exposure to IR light excites the trapped electrons to the excited states of Sm, the electrons transfer to the excited states of Eu and return to the ground state of Eu with the emission of orange/red light. By way of the above mode of operation, the electron trapping materials can be used to store optical information in the form of trapped electrons. This has been described by J. Lindmayer, P. Goldsmith, and C. Wrigley, in "Electronic Optical-Storage Technology Approaches Development Phase", *Laser Focus World*, p. 119, Nov. 1989.

In addition to storage, electron trapping materials are a subject of interest as hardware devices capable of performing multiplication, addition, and subtraction within a dynamic range cover four orders of magnitude The orange/red emission intensity is proportional to the product of the blue write-in intensity and the IR readout intensity. The addition and subtraction are performed by increasing and decreasing the number of trapped electrons. These operations are physically carried out by exposing the electron trapping material to blue and IR light, respectively.

The physical structure of the subtraction device will now be described in greater detail. As illustrated in FIG. 3, device 10 is a card shown in vertical cross-section having a substrate 20 and the electron trapping material 30 applied with a transparent binder to the substrate 20. The substrate 20 may be any transparent material such as glass, quartz or sapphire. The material 30 establishes a planar surface 16. An optical transparent coating 18 may encapsulate the material 30 and substrate 20.

Material 30 is preferably deposited upon substrate 20 using thin film techniques, preferably by physical or chemical vapor deposition. Details concerning the preferred thin film deposition process are set forth in the present assignee's U.S. Pat. Nos. 4,830,875 and 4,915,982, which are herein incorporated by reference.

B. Incoherent Image Subtraction

Incoherent image subtraction using electron trapping materials can be performed by the following two procedures or embodiments of the invention. In the first embodiment, an input image "A" is projected with blue light onto the substrate coated with a thin film of electron trapping material. A pattern of trapped electrons corresponding to input image "A" is then generated in the electron trapping material The subtraction of image "B" from image "A" is performed by an IR projection of input image "B" onto the electron trapping material. A successive uniform IR illumination finally produces the output image (A-B) at 630 nm.

In the second embodiment, the electron trapping material is first uniformly exposed to blue light. The traps are fully filled with excited electrons Then, an input image "B" is projected with IR light onto the electron trapping material. A pattern of trapped electrons proportional to (1-B) is formed. Finally, an input image "A" is also projected with IR light onto the thin-film, generating an emission of A (1-B). When image "B" is binary, A (1-B) is simply an image "A" that has been partially blocked by a mask "B". Any input image "B" can be effectively made binary by a longer IR exposure time that detraps all electrons at the bright portion of image "B".

The methods of the above two embodiments are much simpler than prior art methods using interferometric and holographic techniques.

The electron trapping material is preferably formed as a thin film on a substrate using evaporation, sputtering or other standard thin film deposition technologies. Consequently, the fabrication process is potentially much more cost effective than that of other types of spatial light modulators (SLMs). The response time of electron trapping materials is on the order of several tens of nanoseconds. The resolution of a fabricated 4 micrometer thick electron trapping thin film has been observed to be at least 40 lp/mm. See, "Optical Neurals Network Digital Multi-Value Processor with Learning Capability Using Electron Trapping Materials", cited above. In fact, it is likely that the resolution is even better, since the grain size of the thin film is about 1 micrometer. In the experiments of the preferred embodiments of the described invention, as reported further below, an electron trapping thin powder film fabricated using a doctor blading technique was used as the electron trapping device in the experiments. The thickness and optical resolution of the film were approximately 200 $\mu$m and 6 lp/mm, respectively 1. Application to Machine Inspection The above techniques for image subtraction using electron trapping material may be used for automatic inspection of patterns, such as microcircuit chip transparencies.

Figure 4B:
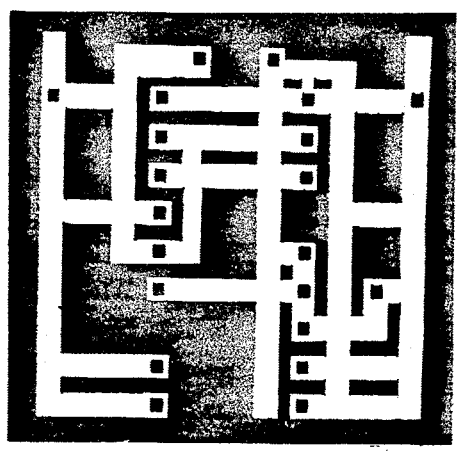
FIG. 4B shows a simulated visual image in the form of a defective or faulty microcircuit chip transparency.
Figure 5:
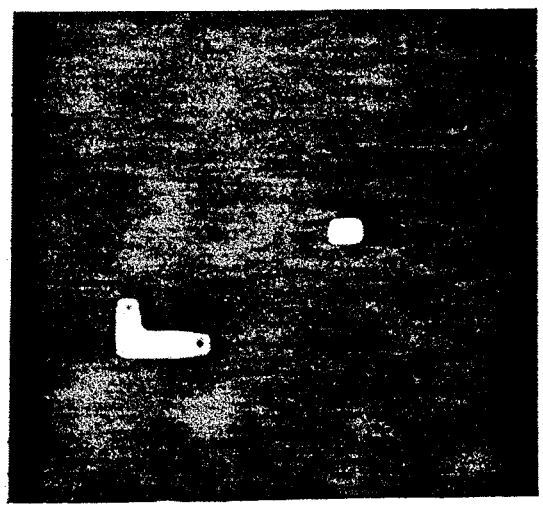
FIG. 5 illustrates a subtraction image showing missing parts resulting from the subtraction of the image of FIG. 4B from the image of FIG. 4A.

To conduct the inspection, the transparancy of a correct microcircuit chip (FIG. 4A) is projected onto the electron trapping material device using blue light from an Argon laser. Subsequently, a second transparency of the chip to be inspected (FIG. 4B) is projected onto the material with IR light from a YAG:Nd laser. Finally, the electron trapping material is flooded with uniform IR light to retrieve the difference as shown in FIG. 5.

Note that, if desired, the first and second transparencies can be simultaneously projected onto the electron trapping device at appropriate wavelengths to reduce the number of process steps. Although two wavelengths are required, this technique is simpler than using a coherent or interferometric technique. An important merit of this technique is its capability of performing gray level subtraction, since the dynamic range of the electron trapping materials is so large. In addition, there is no coherent noise corrupting the desired result, so that even a small missing piece can be detected, as is illustrated by FIG. 5.

2. Application to Signal Correlation

Figure 6A:
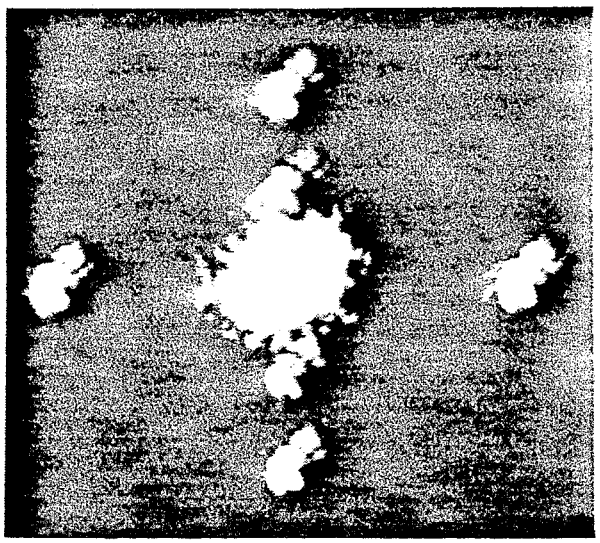
FIG. 6A illustrates a correlation signal and a DC pattern and the background noise signal in the correlation plane.

To improve the detectability and to maximize the information content of a joint transform correlator, such as has been reported by C. S. Weaver and J. W. Goodman, in "A Technique for Optically Convolving Two Functions," *Appl. Opt.* 5, 1248 (1966), the DC pattern appearing in the correlation plane must be removed. A DC pattern subtraction for improving a correlation signal is performed as follows: A realtime joint transform correlator using a liquid crystal television (LCTV) is operated at 1064 nm. Such use of a LCTV is presented by F. T. S. Yu, S. Jutamulia, T. W. Lin, D. A. Gregory, "Adaptive Real-Time Pattern Recognition Using a Liquid Crystal TV Based Joint Transform Correlator," *Applied Opt.* 26, 1370, 1987. Note that the use of IR light shortens the length of a correlator. See, S. Jutamulia, G. M. Storti, W. M. Seiderman, J. Lindmayer, D. A. Gregory, "IR Modulation Using Inexpensive LCTV," *Proc. SPIE*, 1295, 120, 1990. When a correlation fringe pattern is displayed on the LCTV, multi-orders of correlation signal together with the DC signal appear on the correlation plane, which is the Fourier transform plane of the LCTV plane. It is difficult to isolate the correlation signal from the DC and background noise, as shown in FIG. 6A.

Figure 6B:
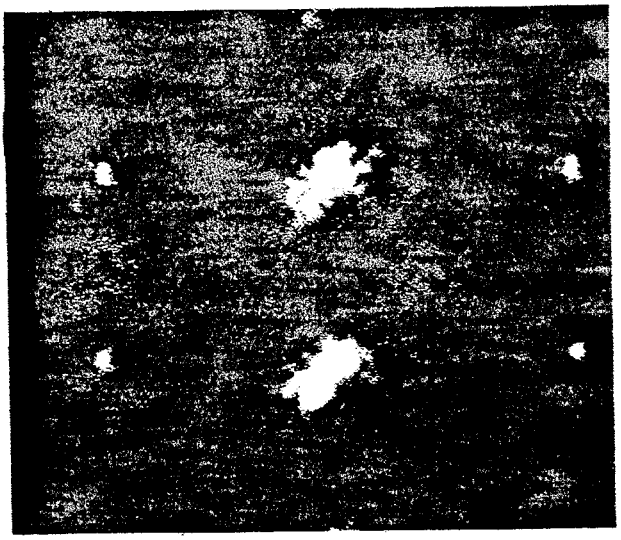
FIG. 6B shows the correlation signal alone after the DC and background noise pattern is subtracted by use of an electron trapping device according to the method of the invention.
Figure 6C:
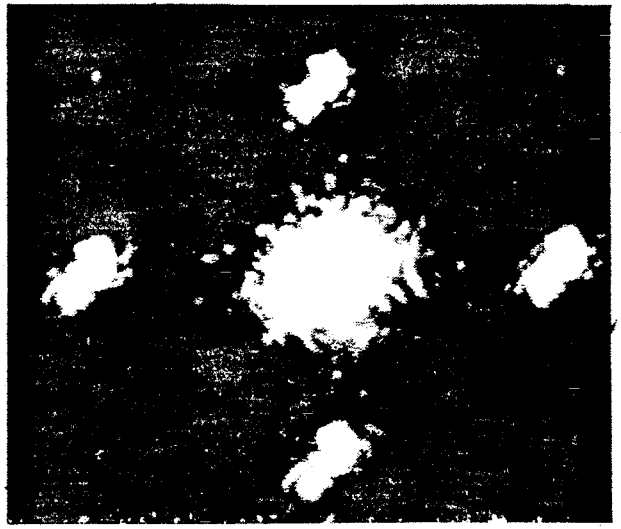
FIG. 6C shows the DC and background noise pattern alone as emitted by the electron trapping device in accordance with the method of the invention.

However, it is possible to remove the DC and background noise from the correlation plane using the following image subtraction technique. An electron trapping device is first uniformly charged with visible light. Then the multi-orders of the DC pattern alone (i.e., nothing is displayed on the LCTV) is projected on the electron trapping device with IR (1064 nm) light. Consequently, electrons are detrapped at the site exposed to the IR light. Finally, the correlation signal together with the DC pattern is projected on the electron trapping device also with IR light. The electron trapping device emits the pattern of the correlation signals alone as depicted in FIG. 6B because there are no trapped electrons at the site of the DC pattern. For comparison, the DC pattern alone is shown in FIG. 6C.

In the following analysis, the correlation signal is represented by C(x,y), and the DC signal is represented by D(x,y). The electron trapping device is first exposed to uniform visible light, so the trapped electron pattern is:

$$E(x,y) = 1 \tag{1}$$

After the DC pattern is projected with IR, the trapped electron pattern becomes:

$$E(x,y) = 1 - D(x,y) \tag{2}$$

When the correlation signal and DC pattern carried by IR light are incident onto the electron trapping sample, the emission is:

$$I(x,y) = [C(x,y) + D(x,y)][1 - D(x,y)] \tag{3}$$

assuming that the interference between $C(x,y)$ and $D(x,y)$ is negligible. Equation (3) can further be written:

$$I(x,y) = C(x,y) + D(x,y) - C(x,y)D(x,y) - D(x,y)^2 \quad (4)$$

In order to get the correlation signal alone, the emission must be:

$$I(x,y) = C(x,y) \quad (5)$$

This can be achieved, if $$D(x,y) - C(x,y)D(x,y) - D(x,y)^2 = 0 \quad (6)$$

When the correlation signal and dc pattern are not overlapping, $$C(x,y)D(x,y) = 0 \quad (7)$$

and Eq.(6) becomes $$D(x,y) - D(x,y)^2 = 0 \quad (8)$$

Since $$0 \leq D(x,y) \leq 1 \quad (9)$$

Eq.(8) is true when $D(x,y)$ is very high (close to 1) or is very low (close to 0). The maximum remaining noise is 0.25, when $D(x,y)$ is 0.5. However, the dc pattern $D(x,y)$ can be effectively made binary (either 1 or 0) by a higher intensity exposure.

When the correlation signal is embedded in the extended DC pattern, Eq.(6) becomes $$C(x,y) + D(x,y) = 1 \quad (10)$$

and $D(x,y)$ is not zero. When $D(x,y)$ is zero, Eq.(6) is always true. Equation (10) indicates that the best retrieval of the embedded correlation signal occurs when the total intensity of the correlation signal, and the extended DC at the location of the correlation signal, is unity. The unity represents the total trapped electron at that location. This shows the possibility of retrieving the embedded correlation signal in the extended DC pattern.

C. Conclusion

In summary, the present invention provides a new incoherent image subtraction technique using electron trapping materials. The primary advantages of the electron trapping based image subtraction technique are: (1) no coherent noise, (2) ability to perform gray level image subtraction, (3) high resolution, (4) high SBP, (5) high speed, and (6) cost effectiveness. The technique can be applied to automation for microcircuit manufacture and inspection, and data compression for videophone, teleconference, high definition TV, etc. A high quality electron trapping thin film can be directly coupled with a CCD chip, such that parallel real-time image subtraction can be performed between two simultaneous scenes or subsequent frames. In contrast, a coherent or interferometric technique cannot perform subtraction between two subsequent frames. The present invention can also be used to improve the detectability of a real-time correlator. Other subtraction-related applications of electron trapping material will now become apparent to those skilled in the art.

Although the present invention has been described in relation to exemplary embodiments thereof, variations and modifications can be effected in these preferred embodiments without detracting from the scope and spirit of the invention.

What is claimed is:

1. A method of image subtraction, comprising the steps of:

(a) writing a first image into an electron trapping material, said first image comprising a pattern of electromagnetic radiation of a first wavelength, said electron trapping material having a plurality of energy levels including a ground level and a trapping level, said electromagnetic radiation of a first wavelength raising electrons in said electron trapping material from said ground level to said trapping level at selected locations corresponding to said first image;

(b) writing a second image into said electron trapping material, said second image comprising a pattern of electromagnetic radiation of a second wavelength, said electromagnetic radiation of a second wavelength releasing trapped electrons in said electron trapping material at selected locations corresponding to said second image, such that electrons remain in traps only at locations in said electron trapping material where said second image does not coincide with said first image; and (c) uniformly exposing said electron trapping material to electromagnetic radiation of said second wavelength to release said remaining electrons from their traps, resulting in the emission of incoherent light from said electron trapping material in a pattern corresponding to the difference between said first image and said second image.

2. A method of image subtraction as recited in claim 1, wherein said electromagnetic radiation of a first wavelength comprises blue light.

3. A method of image subtraction as recited in claim 1, wherein said electromagnetic radiation of a first wavelength comprises energetic radiation selected from the group consisting of X-rays, alpha particles, beta particles, ultraviolet light, or gamma rays.

4. A method of image subtraction as recited in claim 1, wherein said electromagnetic radiation of a second wavelength comprises infrared radiation.

5. A method for inspection of a pattern, comprising the steps of:

(a) projecting an image of a correct pattern onto an electron trapping material using electromagnetic radiation of a first wavelength, said electron trapping material having a plurality of energy levels including a ground level and a trapping level, said electromagnetic radiation of a first wavelength raising electrons in said electron trapping material from said ground level to said trapping level at selected locations corresponding to said image of said correct pattern;

(b) projecting an image of a test pattern onto said electron trapping material using electromagnetic radiation of a second wavelength, said electromagnetic radiation of said second wavelength releasing trapped electrons in said electron trapping material at selected locations corresponding to said image of said test pattern, such that electrons remain in traps only at locations in said electron trapping material where said test pattern does not coincide with said correct pattern; and (c) uniformly exposing said electron trapping material to electromagnetic radiation of a second wavelength to release said remaining electrons from their traps, resulting in the emission of incoherent light from said electron trapping material in a pattern indicating where said test pattern differs from said correct pattern.

6. A method of image substraction as recited in claim 5, wherein said pattern comprises a microchip circuit transparency.

7. A method of image substraction as recited in claim 5, wherein said pattern comprises a video frame.

8. A method of image subtraction as recited in claim 7, wherein said electromagnetic radiation of a first wavelength comprises blue light.

9. A method of image subtraction as recited in claim 7, wherein said electromagnetic radiation of a first wavelength comprises energetic radiation selected from the group consisting of X-rays, alpha particles, beta particles, ultraviolet light, or gamma rays.

10. A method of image subtraction as recited in claim 7, wherein said electromagnetic radiation of a second wavelength comprises infrared radiation.

11. A method of image subtraction, comprising the steps of:

(a) uniformly exposing an electron trapping material to electromagnetic radiation of a first wavelength, said electron trapping material having a plurality of energy levels including a ground level and a trapping level, said electromagnetic radiation of said first wavelength raising electrons in said electron trapping material from said ground level to said trapping level, such that said trapping level becomes substantially filled with electrons;

(b) projecting a first image comprising electromagnetic radiation of a second wavelength onto said electron trapping material, said electromagnetic radiation of a second wavelength releasing electrons from their traps at selected locations corresponding to said first image, such that electrons remain in traps only at locations corresponding to the negative of said first image; and (c) projecting a second image comprising electromagnetic radiation of a second wavelength onto said electron trapping material, said electromagnetic radiation of a second wavelength releasing the remaining electrons from their traps at locations corresponding to where said second image coincides with the first image, resulting in the emission of incoherent light from said electron trapping material in a pattern corresponding to the second image partially blocked by the first image.

12. A method of image subtraction as recited in claim 11, wherein said electromagnetic radiation of a first wavelength comprises blue light.

13. A method of image subtraction as recited in claim 16, wherein said electromagnetic radiation of a first wavelength comprises energetic radiation selected from the group consisting of X-rays, alpha particles, beta particles, ultraviolet light, or gamma rays.

14. A method of image subtraction as recited in claim 11, wherein said electromagnetic radiation of a second wavelength comprises infrared radiation.

* * * * *